United States Patent [19]

Yano et al.

[11] Patent Number: 4,862,473
[45] Date of Patent: Aug. 29, 1989

[54] SEMICONDUCTOR LASER APPARATUS HAVING A HIGH HARMONIC GENERATING WAVEGUIDE

[75] Inventors: Seiki Yano, Kashihara; Toshiki Hijikata, Nara, both of Japan

[73] Assignee: Sharp Kabushiki Kaisha, Osaka, Japan

[21] Appl. No.: 105,585

[22] Filed: Oct. 8, 1987

[30] Foreign Application Priority Data

Oct. 8, 1986 [JP] Japan .............................. 61-154856[U]

[51] Int. Cl.$^4$ ............................................. H01S 3/19
[52] U.S. Cl. .......................................... 372/50; 372/5; 372/22; 307/427; 350/96.15
[58] Field of Search ................. 372/5, 21, 22, 43, 50; 307/427; 350/96.15

[56] References Cited

U.S. PATENT DOCUMENTS 3,619,795 11/1971 Marcatili .............................. 307/427

FOREIGN PATENT DOCUMENTS 0058378 4/1982 Japan ...................................... 372/22

Primary Examiner—William L. Sikes
Assistant Examiner—B. R. R. Holloway
Attorney, Agent, or Firm—Birch, Stewart, Kolasch & Birch

[57] ABSTRACT

A semiconductor laser apparatus includes a groove of a specified length that is formed by etching an end portion of a semiconductor laser element, and a higher harmonic generating device having a waveguide of approximately the same cross-sectional dimensions as the dimensions of the resonator that is mounted in the semiconductor laser element. The higher harmonic generating device is secured by being fused in the groove with the optical axis of the waveguide coinciding with the optical axis of the resonator.

6 Claims, 1 Drawing Sheet

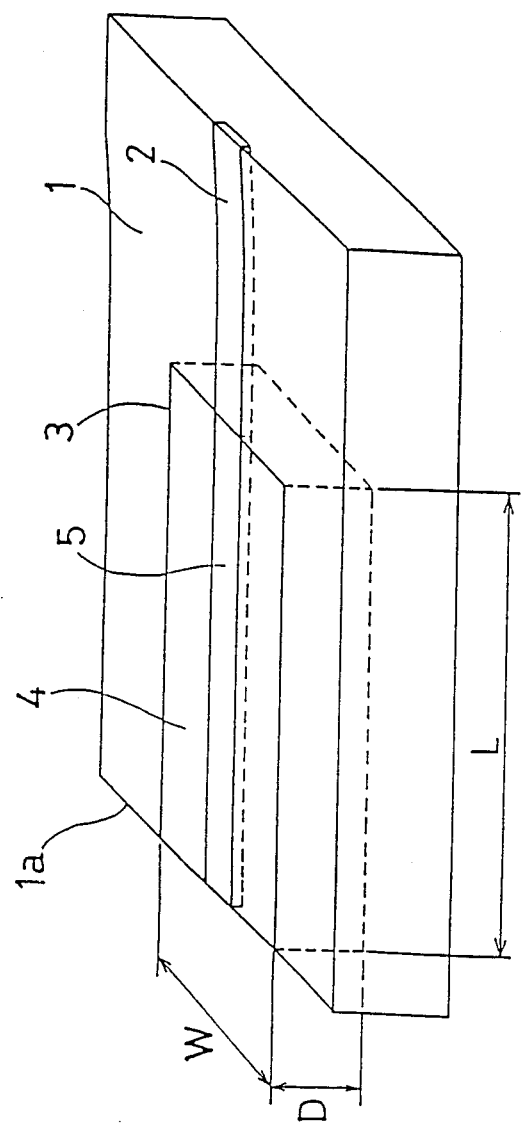

SEMICONDUCTOR LASER APPARATUS HAVING A HIGH HARMONIC GENERATING WAVEGUIDE

BACKGROUND OF THE INVENTION

The embodiments of the present invention relate to a semiconductor laser apparatus emitting a short wave laser beam for use as a light source. For example, the apparatus may be used in an optical disc memory, an optical measuring instrument or medical equipment.

The demand for a short wave laser beam-emitting light source has increased for use in optical disc memories and medical equipment. A method of generating the second higher harmonic by using a nonlinear medium is known as a typical short wave laser beam-generating method and this method is expected to prevail in the future. Particularly, a waveguide type higher harmonic generating device, which is capable of raising the light intensity and density of the fundamental wave, to provide a highly efficient conversion capability is well known.

The above conventional waveguide type higher harmonic generating device is separate from a semiconductor laser apparatus which outputs the fundamental This device is not practical because it is difficult to couple the fundamental wave with the higher harmonic generating device.

SUMMARY OF THE INVENTION

In view of the above reason, the object of the embodiments of the present invention is to provide a semiconductor laser apparatus that is integrally formed with a higher harmonic generating device and is capable of generating a short wave laser beam of high quality.

To achieve the above object, a semiconductor laser apparatus comprises a groove of a specified length formed in an end portion of a semiconductor laser element and a higher harmonic generating device having a waveguide of approximately the same cross-sectional dimensions as those of a resonator mounted in the semiconductor laser element. The higher harmonic generating device secured by being fused in the groove with the optical axis of the waveguide coinciding with the optical axis of the resonator.

According to the embodiment of the present invention, it is possible to realize a highly practical semiconductor laser apparatus capable of easily coupling the fundamental wave with a higher harmonic generating device and outputting short wave laser beams.

BRIEF DESCRIPTION OF THE DRAWINGS

The embodiments of the present invention will become more fully understood from the detailed description given hereinbelow and the accompanying drawings which are given by way of illustration only, and thus are not limitative of the present invention and wherein: The FIGURE is a perspective view of an embodiment of the present invention.

DESCRIPTION OF THE PREFERRED EMBODIMENT

Referring to the FIGURE, a semiconductor laser element 1 has a resonator 2. A diffused base mesa groove 3 is formed in an end portion 1a of the semiconductor laser element 1 by a RIBE (reactive ion beam etching) technique. The groove 3 has a specified length along the optical axis of the resonator 2 and larger width and has a depth than the resonator 2. Mo and Au are deposited by an evaporation process on the bottom of the groove 3. A higher harmonic generating device 4 comprises a nonlinear medium such as $LiNbO_3$ and has approximately the same length L, width W and depth D as the groove 3. A waveguide 5 of almost the same cross-sectional dimensions are those of the resonator 2 is formed in the higher harmonic generating device 4 by a proton substitution method using benzoic acid. After evaporating Mo, Au and In on the outer surfaces of the higher harmonic generating device 4 that are to be made in contact with the groove 3, the higher harmonic generating device 4 is mounted (embedded) in the groove 3, followed by an increase in the ambient temperature so that the higher harmonic generating device 4 is secured by being fused to the semiconductor laser element 1. At this time, since the inside dimensions of the groove 3 are almost the same as the outside dimensions of the higher harmonic generating device 4, the optical axis of the waveguide 5 coincides with that of the resonator 2. Thus, the semiconductor laser apparatus of the present embodiment comprises the higher harmonic generating device 4 that is integrally formed with the semiconductor laser element 1 by a fusion welding technique. With the waveguide 5 of the higher harmonic generating device 4 efficiently bonded by fusion with the resonator 2 of the semiconductor laser element 1, the above embodiment of the present invention very easily generates a short wave laser beam of 390 nm wavelength and of 10 mW output (blue light) for the output of the semiconductor laser element 1 at 100 mW.

While only certain embodiments of the present invention have been described, it will be apparent to those skilled in the art that various changes and modifications may be made therein without departing from the spirit and scope of the present invention as claimed.

What is claimed is:

1. A structure for a semiconductor laser apparatus comprising:
   a semiconductor laser element having a groove of a predetermined length formed from an end portion of said semiconductor laser element;
   a higher harmonic generating device formed to said groove;
   a waveguide of first cross-sectional dimensions formed in said higher harmonic generating device along a first optical axis of said semiconductor laser element; and
   a resonator having approximately said first cross-sectional dimensions disposed along said first optical axis.

2. The structure for a semiconductor laser apparatus of claim 1, wherein Mo and Au are formed in said groove before said higher harmonic generating device is formed and Mo, Au and In are formed on the surfaces of said higher harmonic generating device that are contacted with said groove.

3. A structure for a semiconductor laser apparatus comprising:
   a semiconductor laser element having a groove of a predetermined length and first cross-sectional dimensions formed from an end portion of said semiconductor laser element;
   a higher harmonic generating device formed in said groove;
   a waveguide of second cross-sectional dimensions that are less than said first cross-sectional dimensions being formed in said higher harmonic generating device along a first optical axis of said semiconductor laser element; and a resonator having approximately said second cross-sectional dimensions formed in said semiconductor laser element along said first optical axis.

4. The structure for a semiconductor laser apparatus of claim 3, wherein Mo and Au are formed in said groove before said higher harmonic generating device is formed and Mo, Au and In are formed on the surfaces of said higher harmonic generating device that are to be contacted with said groove.

5. A method for forming a structure for a semiconductor laser apparatus comprising the steps of:

forming a groove of a predetermined length from an end portion of a semiconductor laser element and of first cross-sectional dimensions;

fusing a higher harmonic generating device to said groove;

forming a waveguide of second cross-sectional dimensions that are less than said first cross-sectional dimensions in said higher harmonic generating device along a first optical axis of said semiconductor laser element; and forming a resonator having approximately said second cross-sectional dimensions along said first optical axis.

6. The method of claim 5, wherein said waveguide is formed by a proton substitution method using benzoic acid.

* * * * *